United States Patent [19]
van de Plassche et al.

[11] Patent Number: 4,509,020
[45] Date of Patent: Apr. 2, 1985

[54] PUSH-PULL AMPLIFIER

[75] Inventors: Rudy J. van de Plassche, Sunnyvale, Calif.; Eise C. Dijkmans, Eindhoven, Netherlands

[73] Assignee: U.S. Philips Corporation, New York, N.Y.

[21] Appl. No.: 529,892

[22] Filed: Sep. 7, 1983

[30] Foreign Application Priority Data

Sep. 22, 1982 [NL] Netherlands .......................... 8203667

[51] Int. Cl.$^3$ .............................................. H03F 3/26
[52] U.S. Cl. .................................................... 330/274
[58] Field of Search ......................... 330/262, 273, 274

[56] References Cited
U.S. PATENT DOCUMENTS
4,087,759 5/1978 Iwamatsu ............................. 330/262

Primary Examiner—James B. Mullins
Assistant Examiner—G. Wan
Attorney, Agent, or Firm—Thomas A. Briody; William J. Streeter; Edward W. Goodman

[57] ABSTRACT

For a satisfactory cross-over behavior of the transistors $T_1$ and $T_2$ of push-pull amplifier comprising an input 2 and an output 3, it is necessary that the sum of the base-emitter voltages of the transistors $T_1$ and $T_2$ remains substantially constant. For this purpose a first voltage-current converter 5 is coupled between the base and the emitter of transistor $T_1$, the inverting input of this converter being coupled to the base of transistor $T_1$ via a first reference-voltage source 8 and the non-inverting input to the emitter of transistor $T_1$. Similarly, a second voltage-current converter 9 and a second reference-voltage source 12 are arranged between the base and the emitter of transistor $T_2$. The output currents of the first and the second voltage-current converters 5 and 9 are compared with each other in the combining circuit 14 which drives the control amplifier 15, which in its turn controls the base-emitter voltage of transistor $T_2$ in such a way that the sum of the base-emitter voltages of transistor $T_1$ and $T_2$ remains constant. The push-pull amplifier exhibits a minimal amount of second-harmonic distortion, because only the difference of the errors introduced by the first and the second voltage-current converters 5 and 9 is of importance in this respect and these errors are substantially equal to each other due to the method of fabrication of the voltage-current converters.

8 Claims, 3 Drawing Figures

PUSH-PULL AMPLIFIER

BACKGROUND OF THE INVENTION

The invention relates to a push-pull amplifier comprising a first and a second output transistor of the same conductivity type, whose collector-emitter paths are arranged in series between two power-supply terminals, the base of the first transistor being coupled to an input terminal, the emitter of one transistor and the collector of the other transistor being coupled to an output terminal, which amplifier also comprises means for maintaining the sum of the base-emitter voltages of the first and the second transistor substantially constant.

Such a push-pull amplifier is known from U.S. Pat. No. 4,300,103. In order to ensure a satisfactory crossover behavior in such a push-pull amplifier comprising output transistors of the same conductivity type, the sum of the base-emitter voltages of the output transistors is required to remain substantially constant. When the base-emitter voltage of the first transistor changes upon application of a drive voltage to this transistor, this should cause an equal but opposite change in base-emitter voltage of the second transistor. In the known circuit arrangement, this is achieved by measuring the a.c. signal across the base-emitter junction of the first transistor, forming a signal which is in phase opposition thereto, and driving the base-emitter junction of the second transistor with this opposite-phase signal.

However, such a push-pull amplifier has the drawback that the amplifier exhibits a substantial amount of second-harmonic distortion. This is because the conversion of the base-emitter voltage of the first transistor into the base-emitter voltage of the second transistors is relatively inaccurate, so that the first and the second transistor have different voltage gains, which gives rise to second-harmonic distortion.

SUMMARY OF THE INVENTION

Therefore, it is the object of the invention to provide a push-pull amplifier having a small degree of second-harmonic distortion. To this end a push-pull amplifier of the maintaining type mentioned in the opening paragraph is characterized in that the means comprises a first measuring circuit arranged between the base and the emitter of the first transistor, which first measuring circuit comprises a first voltage-current converter, a second measuring circuit arranged between the base and the emitter of the second transistor, which second measuring circuit comprises a second voltage-current converter, a combining circuit for combining the output currents of the first and the second voltage-current converters, which combining circuit is coupled to a control amplifier which drives the second transistor in such a way that the sum of the base-emitter voltages of the first and the second transistors remains substantially constant. In the push-pull amplifier in accordance with the invention, the base-emitter voltages of the first and the second transistors are measured and converted into currents which are proportional to these voltages, which currents are fed to a combining circuit which drives a control amplifier. This control amplifier controls the base-emitter voltage of the second transistor in such a way that the sum of the base emitter voltages of the first and the second transistors remains substantially constant.

In that case, if the gain of the control amplifier is sufficiently high, the output currents of the first and the second voltage-current converters are substantially equal to each other. The relationship between the input voltage of the second voltage-current converter and the input voltage of the first voltage-current converter is then determined by the ratio of the conversion factors of the voltage-current converters. As this relationship is indicated by the ratio of the conversion factors, only the difference between the errors introduced by the voltage-current converters is of importance for the distortion. The first and the second voltage-current converters can be manufactured in an accurately identical manner so that they introduce the same error, which results in a very small amount of second-harmonic distortion.

One embodiment is characterized in that a first reference-voltage source is arranged in the first measuring circuit and a second reference-voltage source is arranged in the second measuring circuit. By means of these reference voltage sources, the sum of the base-emitter voltages of the first and the second transistor is maintained constant relative to the sum of these reference voltages.

A further embodiment in which the first and the second transistors are each formed by two transistors of the same conductivity type arranged as a Darlington pair, is characterized in that the first reference-voltage source comprises a further transistor of a conductivity type opposite to that of the first transistor, which further transistor has its base coupled to the input terminal, its collector to a power-supply terminal and its emitter to the base of the first transistor, a current source being arranged in the emitter circuit, the first reference-voltage source also comprising a diode poled in the forward direction, which diode is arranged in the emitter circuit of the first transistor in such a way that its forward direction, viewed from the emitter of the first transistor, is the same as the forward direction of the base-emitter junction of the first transistor. Across the base-emitter junction of the further transistor and the diode, a voltage appears which is substantially equal to the sum of the base-emitter voltages of the first Darlington pair, so that the a.c. component of the base-emitter voltage of the first output transistor is mainly applied to the first voltage-current converter. The further transistor, which is arranged as an emitter follower, has the advantage that a high input impedance of the circuit is obtained.

A further embodiment is characterized in that the first voltage-current converter comprises a third and a fourth transistors, arranged as a differential pair, a resistor for carrying signal current being arranged between the emitters, the base of the third transistor being coupled to the input terminal, and the base of the fourth transistor being coupled to the emitter of the first transistor. If the resistance of the emitter resistor is not too low, this resistor determines the conversion factor of the voltage-current converter. Thus, the conversion factor can be adjusted by a suitable choice of the emitter resistor. The second voltage-current converter is suitably constructed in the same way as the first voltage-current converter and is characterized in that the second voltage-current converter comprises a fifth and a sixth transistors arranged as a differential pair, a resistor for carrying signal current being arranged between the emitters of these last-mentioned transistors, the base of the fifth transistor being coupled to the base of the second transistor, and the base of the sixth transistor being coupled to the emitter of the second transistor.

Yet another embodiment is characterized in that the combining circuit comprises a current mirror whose output is coupled to the input of the control amplifier. In still another embodiment the current mirror comprises a seventh transistor arranged as a diode, an eighth transistor and a ninth transistor, the emitters of the seventh and the eighth transistors being coupled to a power-supply terminal via resistors, the bases of the seventh and the eighth transistors being coupled to each other, the collector of the eighth transistor being coupled to a current source and to the base of the ninth transistor, which ninth transistor has its emitter coupled to the collector of the seventh transistor and its collector to a current source, the emitters of the seventh and the eighth transistors being coupled to the collectors of the third transistor and the fourth transistor, respectively, and the collectors of the eighth and the ninth transistors being coupled to the collector of the sixth transistor and to the collector of the fifth transistor and the output of the current mirror, respectively.

A further embodiment is characterized in that the control amplifier comprises a transistor which has its collector coupled to a power-supply terminal, its emitter to the base of the second transistor, and its base to the output of the current mirror.

DESCRIPTION OF THE DRAWINGS

The invention will now be described in more detail, by way of example, with reference to the accompanying drawings, in which.

DESCRIPTION OF THE PREFERRED EMBODIMENTS

Figure 1:
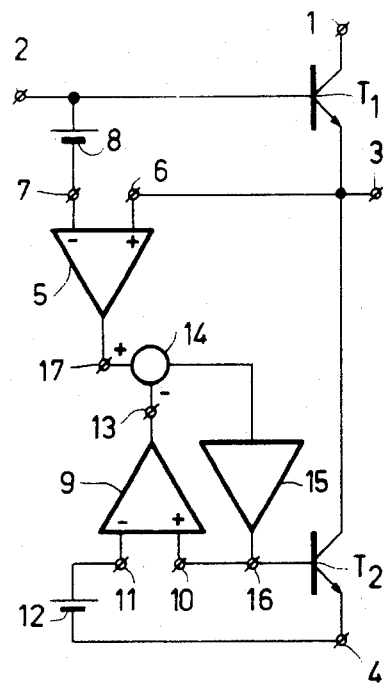
FIG. 1 is the basic diagram of a push-pull amplifier in accordance with the invention.

In the basic circuit diagram shown in FIG. 1, the two npn output transistors of a push-pull amplifier are designated $T_1$ and $T_2$. The collector of the first transistor $T_1$ is connected to a positive voltage terminal 1 and the base is connected to an input 2. The emitter of transistor $T_1$ and the collector of the second transistor $T_2$ are connected to an output 3. The emitter of transistor $T_2$ is connected to a negative voltage terminal 4. When the first transistor $T_1$ is driven with an input signal at input 2, the second transistor $T_2$ is driven in such a way that the sum of the base-emitter voltages of the transistors $T_1$ and $T_2$ remains constant. For this purpose, a first voltage-current converter 5 is coupled between the base and the emitter of transistor $T_1$. The non-inverting input 6 of this voltage-current converter 5 is connected to the emitter of transistor $T_1$ and the inverting input 7 is connected to the negative terminal of a first reference-voltage source 8, whose positive terminal is connected to the base of transistor $T_1$. The voltage-current converter 5 supplies a current to the output 17, which current is proportional to $V_{ref1}-V_{be1}$, $V_{ref1}$ being the reference voltage of the source 8 and $V_{be1}$ being the base-emitter voltage of transistor $T_1$. Similarly, a second voltage-current converter 9 is coupled between the base and the emitter of transistor $T_2$. The non-inverting input 10 of this converter is connected to the base of transistor $T_2$ and the inverting input 11 is connected to the positive terminal of a second reference-voltage source 12, whose negative terminal is connected to the emitter of transistor $T_2$. The voltage-current converter 9 supplies a current to the output 13, which current is proportional to $V_{be2}-V_{ref2}$, $V_{ref2}$ being the reference voltage of the voltage source 12 and $V_{be\,2}$ being the base-emitter voltage of transistor $T_2$. The output currents of the voltage-current converters 5 and 9 are subtracted from each other in a combining circuit 14. The output current of the combining circuit 14 drives a control amplifier 15, whose output 16 is connected to the base of the second transistor $T_2$.

The circuit operates as follows. When transistor $T_1$ is driven with a signal on the input 2, for example an increase of the base-emitter voltage $V_{be1}$ of transistor $T_1$ results in a decrease of the input signal $V_{ref1}-V_{be1}$ of the voltage-current converter 5 and consequently a decrease of the output current of the voltage-current converter 5. As a result of this, a signal current will flow in the output of the combining circuit 14, which current drives the control amplifier 15. The control amplifier 15 now drives the base of the transistor $T_2$ in such a way that the base-emitter voltage $V_{be2}$ of transistor $T_2$ decreases to the same extent as the base-emitter voltage $V_{be1}$ of transistor $T_1$ has increased. The decrease of the base-emitter voltage $V_{be2}$ of transistor $T_2$ gives rise to a decrease of the input signal $V_{be2}-V_{ref2}$ of the second voltage-current converter 9, which results in a decrease of the output current of the second voltage-current converter 9. The decrease of the first voltage-current converter 5 and the decrease of the second voltage-current converter 9 are compared with each other in the combining circuit 14. When they are not the same, the combining circuit supplies a current to the control amplifier 15, which in its turn controls the base-emitter voltage $V_{be2}$ of transistor $T_2$. Thus, transistor $T_2$ is controlled in such a way that $V_{ref1}-V_{be1}=V_{be2}-V_{ref2}$. This ensures that the sum of the base-emitter voltages of transistors $T_1$ and $T_2$ remain substantially constant. In this way control amplifier 15 ensures that the output currents of the first and the second voltage-current converters 5 and 9 become equal to each other. The currents are equal to $(V_{ref}-V_{be1})\times G_1$ and $(V_{be2}-V_{ref2})\times G_2$, $G_1$ and $G_2$ being the conversion factors of the first and the second voltage-current converter 5 and 9. The relationship between $V_{be2}$ and $V_{be1}$ is then determined by the ratio of the conversion factors $G_2$ and $G_1$. Therefore, only the difference of the errors introduced by the first and the second voltage-current converters 5, 9 is of importance for the second-harmonic distortion. Since the two voltage-current converters 5 and 9 are highly identical, they introduce the same error, so that only a very small amount of second-harmonic distortion occurs. Should this not be the case, it is possible to minimize the second-harmonic distortion by adjusting the conversion factor of one of the voltage-current converters.

Instead of driving the first transistor $T_1$ and controlling the base-emitter voltage of the second transistor $T_2$ in such a way that the sum of the base-emitter voltages remains constant, it is also possible to drive the second transistor $T_2$ and to control the base-emittter voltage of the first transistor $T_1$ in such a way that the sum of the base-emitter voltages remains constant. The output of the control amplifier should then be connected to the base of the first transistor $T_1$.

Figure 2:
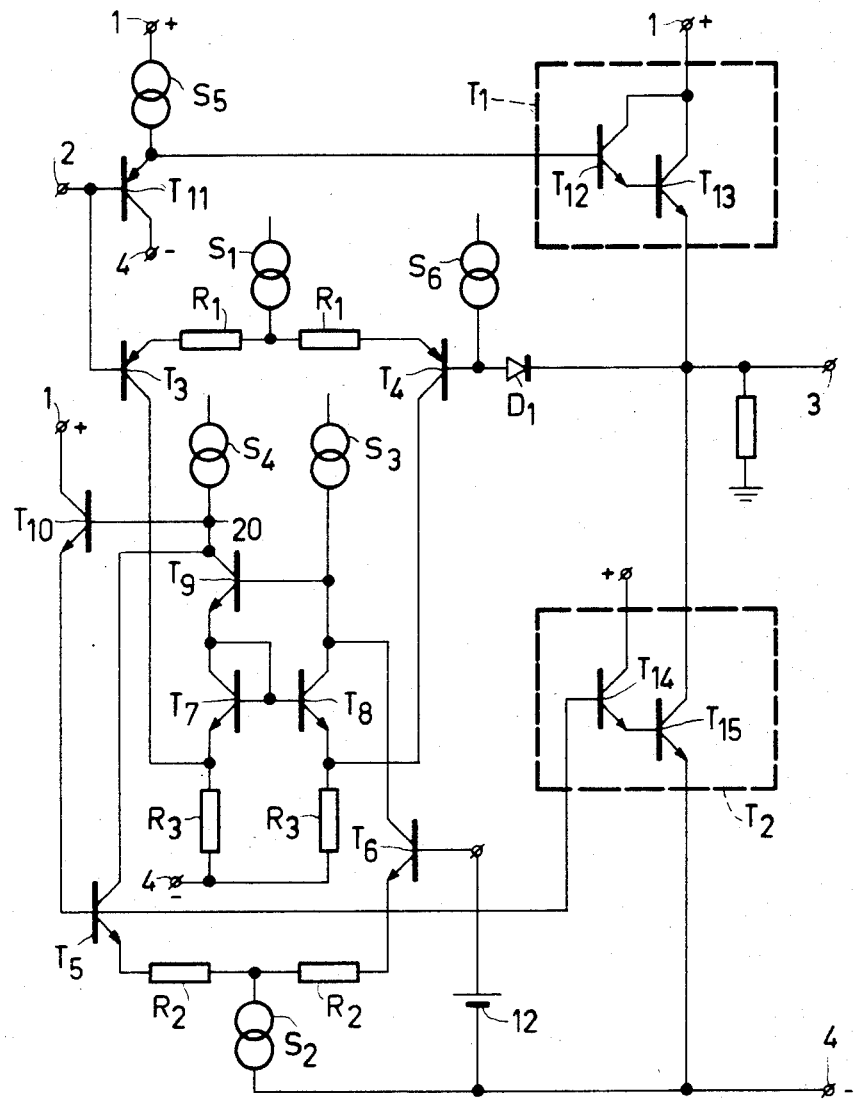
FIG. 2 shows the circuit diagram of an embodiment of a push-pull amplifier in accordance with the invention.

A suitable embodiment of a push-pull amplifier in accordance with the invention will be described with reference to FIG. 2, which shows the circuit diagram in which identical parts bear the same reference numerals as in FIG. 1. The first output transistor $T_1$ is formed by a transistor $T_{13}$ which is driven by a transistor $T_{12}$ in Darlington arrangement. The first reference voltage source 8 is partly formed by a transistor $T_{11}$, which has its base connected to the input 2, its emitter to the base of the transistor $T_{12}$, and its collector to the negative power-supply terminal 4. The bias current through this transistor $T_{11}$ is supplied by a current source $S_5$, arranged in the emitter circuit. As a result of the constant current supplied by this current source, the base-emitter voltage of transistor $T_{11}$ is substantially constant. This transistor $T_{11}$, which is arranged as an emitter follower, also ensures that the circuit has a high input impedance. The first reference-voltage source 8 further comprises a diode $D_1$ which is driven in the forward direction by a current source $S_6$. The diode $D_1$ is connected to the emitter of transistor $T_{13}$ in such a way that, viewed from the output 3, the forward direction of the diode $D_1$ is the same as the forward direction of the base-emitter junction of transistor $T_{13}$. Consequently, the first reference-voltage is provided by the sum of the constant base-emitter voltage of transistor $T_{11}$ and the constant voltage across the diode $D_1$. Alternatively, the reference source may be formed in any other known manner.

The first voltage-current converter 5 comprises two transistors $T_3$ and $T_4$ arranged as a differential pair, two resistors $R_1$ being arranged between the emitters. The bias current through transistors $T_3$ and $T_4$ is provided by a current source $S_1$, which is connected to the junction point of the resistors $R_1$. The base of transistor $T_3$ is connected to the input 2 and constitutes the inverting input of the first voltage-current converter 5. The base of transistor $T_4$ is coupled to the emitter of transistor $T_{13}$ via the diode $D_1$ and constitutes the non-inverting input of the first voltage-current converter 5.

In the same way as the first output transistor $T_1$, the second output transistor $T_2$ takes the form of a transistor $T_{15}$ which is driven by a transistor $T_{14}$ in Darlington arrangement. The second voltage-current converter 9 comprises two transistors $T_5$ and $T_6$ arranged as a differential pair, two equal resistors $R_2$ being arranged between the emitters. The bias current through the transistors $T_5$ and $T_6$ is provided by a current source $S_2$, which is connected to the junction point of the resistors $R_2$. The base of the transistor $T_5$ is connected to the base of the transistor $T_{14}$ and constitutes the non-inverting input of the second voltage-current converter 9. The base of the transistor $T_6$ is connected to the second reference-voltage source 12, which may be constructed in known manner. As an example, the second reference voltage source 12 may comprise two diodes arranged in series, which are driven in the forward direction by a current source and which are arranged between the base of transistor $T_6$ and the negative power-supply terminal 4.

The combining circuit 14 for combining the output currents of the first and the second voltage-current converters 5 and 9 comprises a current mirror equipped with transistors $T_7$, $T_8$ and $T_9$. The transistor $T_7$, which is arranged as a diode, has its base connected to the base of transistor $T_8$. The emitters of the transistors $T_7$ and $T_8$ are connected to the negative power-supply terminal 4 via respective resistors $R_3$. The emitters of transistor $T_7$ and transistor $T_8$ are further connected to the collectors of transistors $T_3$ and $T_4$, respectively, of the first voltage-current converter 5. The collector of transistor $T_7$ is connected to the emitter of transistor $T_9$, whose base is connected to the collector of transistor $T_8$. The bias currents of the transistors $T_7$, $T_8$ and $T_9$ are provided by a current source $S_3$ and a current source $S_4$, arranged in the collector circuits of transistor $T_8$ and transistor $T_9$, respectively. The collector of transistor $T_8$ and the collector of transistor $T_9$ are further connected to the collector of transistor $T_6$ and to the collector of transistor $T_5$, respectively, of the second voltage-current converter 9.

Figure 3:
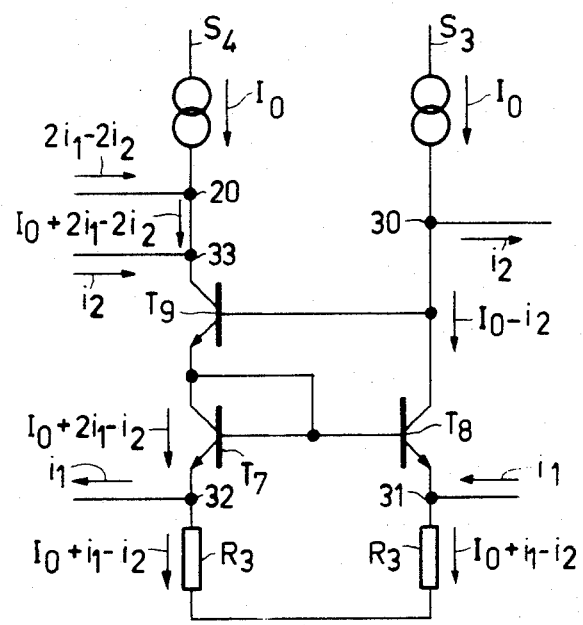
FIG. 3 shows the current mirror used in the embodiment in FIG. 2.

The operation of the current mirror $T_7$–$T_9$ will be described with reference to FIG. 3, which shows the current mirror $T_7$–$T_9$ of FIG. 2 separately. A current sources $S_3$ and $S_4$ each supply an equal current $I_o$. The terminal 30 is connected to the collector of transistor $T_6$. If the signal current in the collector circuit of transistor $T_6$ is $i_2$, a current $I_o$–$i_2$ will flow in the collector circuit of transistor $T_8$. The base currents through transistors $T_7$, $T_8$ and $T_9$ are negligible. Terminal 31 is connected to the collector of transistor $T_4$. If the collector current of transistor $T_4$ is $i_1$, a current $I_o+i_1-i_2$ will flow through the resistor $R_3$ in the emitter circuit of transistor $T_8$. As a result of the current-mirror action of transistors $T_7$, $T_8$, the current which flows through the resistor $R_3$ in the emitter circuit of transistor $T_7$ is also equal to $I_o+i_1-i_2$. Terminal 32 is connected to the collector of transistor $T_3$, so that a signal current $i_1$ will flow which is equal but opposite to the collector current of transistor $T_4$. The collector current of transistor $T_7$ and the collector current of transistor $T_9$ is then $I_o+2i_1-i_2$. Terminal 33 is connected to the collector of transistor $T_3$, which carries a signal current $i_2$ which is equal but opposite to the collector current of transistor $T_5$. The current in the line between the output 20 and the terminal 33 will then be $I_o+2i_1-2i_2$. Since the current source $S_4$ supplies a constant current $I_o$, a current equal to $2i_1-2i_2$ will flow in the output line of the current mirror.

In this way a signal current equal to the difference between the collector currents of transistors $T_3$ and $T_4$ minus the difference between the collector currents of transistors $T_5$ and $T_6$, or the difference between the output currents of the two voltage-current converters 5 and 9, will appear on the base of transistor $T_{10}$, which is the output of the combining circuit 14.

Transistor $T_{10}$, whose base is connected to the output of the current mirror $T_7$–$T_9$, constitutes the control amplifier 15. The collector is connected to the positive power-supply terminal 1, while the emitter is connected to the base of driver transistor $T_{14}$ of the second output transistor $T_2$ and to the base of $T_5$. If the signal current in the base of transistor $T_{10}$, for example, decreases, the collector current of transistor $T_{10}$ and hence the base current of transistor $T_{14}$ decreases, so that the base-emitter voltage of the second output transistor 2 also decreases.

In the embodiment described in the foregoing, the differential pair $T_5$–$T_6$ may alternatively be equipped with PNP-transistors instead of NPN-transistors. The collectors of transistors $T_5$–$T_6$ may then be connected to the same input of the current mirror $T_7$–$T_9$ as the collectors of the transistors $T_3$ and $T_4$.

What is claimed is:

1. A push-pull amplifier comprising a first and a second output transistor of the same conductivity type, whose collector-emitter paths are arranged in series between two power-supply terminals, the base of the first transistor being coupled to an input terminal, the emitter of one transistor and the collector of the other transistor being coupled to an output terminal, which amplifier further comprises means for maintaining the sum of the base-emitter voltages of the first and the second transistors substantially constant, characterized in that the maintaining means comprises a first measuring circuit arranged between the base and the emitter of the first transistor, which first measuring circuit comprises a first voltage-current converter, a second measuring circuit arranged between the base and the emitter of the second transistor, which second measuring circuit comprises a second voltage-current converter, a combining circuit for combining the output currents of the first and the second voltage-current converters, and a control amplifier coupled to an output of said combining circuit, said control amplifier driving the second transistor in such a way that the sum of the base-emitter voltages of the first and the second transistors remains substantially constant.

2. A push-pull amplifier as claimed in claim 1, characterized in that the control amplifier comprises a transistor which has its collector coupled to a power-supply terminal, its emitter to the base of the second transistor, and its base to the output of the current mirror.

3. A push-pull amplifier as claimed in claim 1, characterized in that a first reference-voltage source is arranged in the first measuring circuit and a second reference-voltage source is arranged in the second measuring circuit.

4. A push-pull amplifier as claimed in claim 3, the first and the second transistor each being formed by two transistors of the same conductivity type arranged as a Darlington pair, characterized in that the first reference-voltage source comprises a further transistor of a conductivity type opposite to that of the first transistor, which further transistor has its base coupled to the input terminal, its collector to a power-supply terminal and its emitter to the base of the first transistor, a current source being arranged in the emitter circuit, and the first reference-voltage source also comprises a diode poled in the forward direction, which diode is arranged in the emitter circuit of the first transistor in such a way that its forward direction, viewed from the emitter of the first transistor, is the same as the forward direction of the base-emitter junction of the first transistor.

5. A push-pull amplifier as claimed in claim 1, 3 or 4, characterized in that the first voltage-current converter comprises a third and a fourth transistor, arranged as a differential pair, a resistor for carrying signal current being arranged between the emitters, the base of the third transistor being coupled to the input terminal, and the base of the fourth transistor being coupled to the emitter of the first transistor.

6. A push-pull amplifier as claimed in claim 1, 3 or 4, characterized in that the second voltage-current converter comprises a fifth and a sixth transistor arranged as a differential pair, a resistor for carrying signal current being arranged between the emitters of these last-mentioned transistors, the base of the fifth transistor being coupled to the base of the second transistor, and the base of the sixth transistor being coupled to the emitter of the second transistor.

7. A push-pull amplifier as claimed in claim 6, characterized in that the combining circuit comprises a current mirror whose output is coupled to the input of the control amplifier.

8. A push-pull amplifier as claimed in claim 7, characterized in that the current mirror comprises a seventh transistor arranged as a diode, an eighth transistor and a ninth transistor, the emitters of the seventh and the eighth transistor being coupled to a power-supply terminal via resistors, the bases of the seventh and the eighth transistor being coupled to each other, the collector of the eighth transistor being coupled to a current source and to the base of the ninth transistor, which ninth transistor has its emitter to the collector of the seventh transistor and its collector to a current source, the emitters of the seventh and the eighth transistor being coupled to the collector of the third and the fourth transistor, respectively, and the collectors of the eighth and the ninth transistor being coupled to the collector of the sixth transistor and to the collector of the fifth transistor and the output of the current mirror, respectively.

* * * * *